(12) United States Patent
Ning et al.

(10) Patent No.: US 12,154,629 B2
(45) Date of Patent: Nov. 26, 2024

(54) MULTI-TIME PROGRAMMABLE NON-VOLATILE MEMORY CELL AND MEMORY WITH LOW POWER-COST

(71) Applicant: Chengdu Analog Circuit Technology Inc., Sichuan (CN)

(72) Inventors: Dan Ning, Sichuan (CN); Yulong Wang, Sichuan (CN)

(73) Assignee: CHENGDU ANALOG CIRCUIT TECHNOLOGY INC., Sichuan (CN)

( * ) Notice: Subject to any disclaimer, the term of this patent is extended or adjusted under 35 U.S.C. 154(b) by 142 days.

(21) Appl. No.: 18/186,408

(22) Filed: Mar. 20, 2023

(65) Prior Publication Data

US 2023/0326529 A1 Oct. 12, 2023

(30) Foreign Application Priority Data

Apr. 11, 2022 (CN) .......................... 202210376684.X

(51) Int. Cl.
| | | |
|---|---|---|
| G11C 5/02 | (2006.01) | |
| G11C 16/04 | (2006.01) | |
| G11C 16/10 | (2006.01) | |
| G11C 16/14 | (2006.01) | |

(52) U.S. Cl.
CPC ........ G11C 16/102 (2013.01); G11C 16/0433 (2013.01); G11C 16/14 (2013.01)

(58) Field of Classification Search
CPC .. H01L 27/115; H01L 27/11521; H01L 16/10; G11C 16/10; G11C 16/0416; G11C 16/0483
USPC ................................................ 365/185.05, 51
See application file for complete search history.

(56) References Cited

U.S. PATENT DOCUMENTS 5,847,993 A * 12/1998 Dejenfelt ........... G11C 16/0441
257/E27.103
2010/0157669 A1 * 6/2010 Audzeyeu .............. H10B 41/30
365/185.15

* cited by examiner

*Primary Examiner* — Son T Dinh
(74) *Attorney, Agent, or Firm* — Hodgson Russ LLP

(57) ABSTRACT

A multi-time programmable non-volatile memory cell includes: a deep N-well, and first, second, third P-wells or a first N-well located in parallel to each other in the deep N-well, where a control capacitor and a tunneling capacitor are located in the first P-well and the second P-well, respectively, and each of the control capacitor and the tunneling capacitor includes one or two N-type coupling regions in the P-well; one floating-gate transistor is located in the third P-well or the first N-well, the floating-gate transistor including a polysilicon floating gate and its underlying gate oxide; and the floating gate of the floating-gate transistor and its gate oxide extend along a direction perpendicular to the parallel P-wells to cover the control capacitor and the tunneling capacitor, respectively forming an upper plate and a gate oxide of the control capacitor and the tunneling capacitor.

18 Claims, 5 Drawing Sheets

| | memory cell | BL | WL | COM | CL | TL | N-well & deep N-well |
|---|---|---|---|---|---|---|---|
| Program cell 100 | 100 | \ | \ | 0 | Vpp | Vnn | Vpp |
| | 101 | \ | \ | 0 | Vpp | 0 | Vpp |
| | 102 | \ | \ | 0 | 0 | Vnn | Vpp |
| | 103 | \ | \ | 0 | 0 | 0 | Vpp |
| Erase cell 100 | 100 | \ | \ | 0 | Vnn | Vpp | Vpp |
| | 101 | \ | \ | 0 | Vnn | 0 | Vpp |
| | 102 | \ | \ | 0 | 0 | Vpp | Vpp |
| | 103 | \ | \ | 0 | 0 | 0 | Vpp |
| Read cell 100 | 100 | Vrd | VDD | 0 | 0 | 0 | 0 |
| | 101 | \ | VDD | 0 | 0 | \ | 0 |
| | 102 | Vrd | \ | \ | \ | 0 | 0 |
| | 103 | \ | \ | \ | \ | \ | 0 |

MULTI-TIME PROGRAMMABLE NON-VOLATILE MEMORY CELL AND MEMORY WITH LOW POWER-COST

CROSS-REFERENCE TO RELATED APPLICATIONS

This application claims priority to Chinese Patent Application No. 202210376684.X, filed on Apr. 11, 2022, the entire disclosure of which is incorporated herein by reference.

FIELD

The present disclosure relates generally to a non-volatile memory cell and memory thereof, and more particularly, to an electrically programmable erasable non-volatile memory cell having a deep N-well, which can isolate the memory cell from a substrate.

BACKGROUND

Data stored in a non-volatile memory persists even after power is cut off, and can be retained for a long time. Due to this advantage, such memories have been widely used in electronic devices. In particular, a multi-time electrically programmable erasable non-volatile memory allows data to be written, erased, or the like multiple times, and therefore has a wide range of applications. Such non-volatile memories are mostly of a single-polysilicon floating gate type, and programmed and erased mainly by means of channel hot electron injection. During programming, hot electrons in a channel inject to a floating gate, and causing a large current in the channel and high power consumption.

At present, there is a great demand for a low power-cost memory in the industry. Therefore, it is required to optimize such memories to achieve low power consumption.

SUMMARY

The present disclosure provides an electrically erasable multi-time programmable erasable non-volatile memory cell and memory with low power-cost.

The memory cell and memory in the present disclosure perform programming and erasing operations at a gate oxide layer of a tunneling capacitor through Fowler-Nordheim (F-N) tunneling.

A first aspect of the present disclosure relates to a multi-time programmable erasable non-volatile memory cell, including: a deep N-well; and a first P-well, a second P-well, and a third P-well or a first N-well, which are located in parallel to each other in the deep N-well, where a control capacitor and a tunneling capacitor are located in the first P-well and the second P-well, respectively, and each of the control capacitor and the tunneling capacitor includes one or two N-type coupling regions in the P-well; one floating-gate transistor is located in the third P-well or the first N-well, the floating-gate transistor including a polysilicon floating gate and its underlying gate oxide layer; and the floating gate of the floating-gate transistor and its gate oxide layer extend along a direction perpendicular to the parallel direction of the parallel P-wells to cover the control capacitor and the tunneling capacitor in the first P-well and the second P-well, respectively forming an upper plate and a gate oxide layer of the control capacitor and the tunneling capacitor.

In an embodiment, the area of the gate oxide layer in the control capacitor is greater than that of the gate oxide layer in the tunneling capacitor, and a ratio of the two areas ranges from 1.1:1.0 to 50:1.0.

In another embodiment, each of the control capacitor and the tunneling capacitor is a transistor, and includes two N-type coupling regions in the P-well that are arranged at both sides of the upper plate.

In still another embodiment, the floating-gate transistor is an NMOS transistor located in the third P-well. For example, the third P-well is located between the first P-well and the second P-well, or on one side of the first P-well and the second P-well, and two adjacent ones of the three P-wells are separated by an additional N-well that is not the first N-well.

In still another embodiment, the floating-gate transistor is a PMOS transistor located in the first N-well, and the first N-well is located between the first P-well and the second P-well, or at one side of the first P-well and the second P-well; and when the first N-well is located at one side of the first P-well and the second P-well, the first P-well and the second P-well are separated by an additional N-well that is not the first N-well.

In still another embodiment, the memory cell further includes one selection transistor located in the well where the floating-gate transistor is located and connected in series with the floating-gate transistor, where the selection transistor includes a selection gate and its underlying gate oxide layer, a source, and a drain, the floating-gate transistor also includes a source and a drain, and the source of the selection transistor and the drain of the floating-gate transistor are a common terminal.

A second aspect of the present disclosure relates to a multi-time programmable erasable non-volatile memory apparatus fabricated on a P-type substrate, the memory apparatus including: at least one non-volatile memory cell described above in the present disclosure, where deep N-wells of all memory cells merge to form a single deep N-well and located in the P-type substrate; all the memory cells are arranged in multiple rows and columns with the same orientation and arrangement, and the direction of the column is consistent with the parallel direction of the parallel P-wells in the memory cell; and the first P-well, the second P-well, the third P-well or the first N-well, and the additional N-well sandwiched between two adjacent P-wells of the memory cell in each column merge respectively along the direction of the column.

In an embodiment, the memory apparatus further includes: a bit line, a common line, a control line, and a tunneling line, where the common line is connected to the source of each floating-gate transistor in a row of memory cells, the control line is connected to one or two N-type coupling regions of each control capacitor in a row of memory cells, and the tunneling line is connected to one or two N-type coupling regions of each tunneling capacitor in a column of memory cells; in the absence of a selection transistor in the apparatus, the bit line is connected to the drain of each floating-gate transistor in the column of memory cells; and in the presence of the selection transistor in the apparatus, the bit line is connected to the drain of each selection transistor in the column of memory cells, in which case there is further a word line connected to the gate of each selection transistor in the row of memory cells.

In a further embodiment, the control line is connected to two N-type coupling regions of each control capacitor in a row of memory cells and the first P-well where the control capacitor is located, and the tunneling line is connected to two N-type coupling regions of each tunneling capacitor in a column of memory cells and the second P-well where the tunneling capacitor is located.

A third aspect of the present disclosure relates to a multi-time programmable erasable non-volatile memory cell group, including: two memory cells of the present disclosure, named as the first memory cell and the second memory cell, where for each of the two cells, the third P-well or the first N-well where the floating-gate transistor is located is located between the first P-well and the second P-well; where the two floating-gate transistors in the two cells share one source, and the control capacitor and the tunneling capacitor in the first memory cell share one N-type coupling region with the tunneling capacitor and the control capacitor in the second memory cell, respectively; and where deep N-wells of the two cells merge together, the first P-well and the second P-well in the first memory cell merge with the second P-well and the first P-well in the second memory cell, respectively; and the third P-well or the first N-well in the first memory cell merge with that in the second memory cell, and the additional N-well sandwiched between two adjacent P-wells in the first memory cell also merge with that sandwiched between two adjacent P-wells in the second memory cell.

In an embodiment, both the memory cells in the memory cell group perform programming and erasing operations at gate oxides of their tunneling capacitors through Fowler-Nordheim tunneling. For example, a ratio of the area of the gate oxide layer in the control capacitor to the area of the gate oxide layer in the tunneling capacitor in the first memory cell is the same as that in the second memory cell, and the ratios both range from 1.1:1.0 to 50:1.0.

In another embodiment, the structure and composition of the first memory cell are the same as those of the second memory cell.

A fourth aspect of the present disclosure relates to a multi-time programmable erasable non-volatile memory apparatus fabricated on a P-type substrate, the memory apparatus including: at least one memory cell group described above in the present disclosure, where deep N-wells of all memory cell groups merge together to form a single deep N-well and located in the P-type substrate; all the memory cell groups are arranged in multiple rows and columns with the same orientation and arrangement, and the direction of the column is consistent with the parallel direction of the parallel P-wells in the memory cell; and the P-wells and the N-wells of the memory cell groups in each column merge respectively along the direction of the column.

In an embodiment, the non-volatile memory apparatus further includes: a bit line, a common line, a control line, and a tunneling line, where the common line is connected to the common source of two floating-gate transistors in each memory cell group in a row, the control line is connected to one or two N-type coupling regions of the control capacitor of the first memory cell and one or two N-type coupling regions of the tunneling capacitor of the second memory cell in each memory cell group in a row; the tunneling line is connected to one or two N-type coupling regions of the tunneling capacitor of the first memory cell and one or two N-type coupling regions of the control capacitor of the second memory cell in each memory cell group in a column; in the absence of a selection transistor in the apparatus, the bit line is connected to drains of two floating-gate transistors in each memory cell group in the column; and in the presence of the selection transistor in the apparatus, the bit line is connected to drains of two selection transistors in each memory cell group in the column, in which case there is further a word line connected to gates of two selection transistors in each memory cell group in the row.

In a further embodiment, the control line in the non-volatile memory apparatus is connected to two N-type coupling regions of the control capacitor of the first memory cell in each memory cell group in a row and the P-well where the control capacitor is located, and two N-type coupling regions of the tunneling capacitor of the second memory cell in each memory cell group in a row and the P-well where the tunneling capacitor is located; and the tunneling line is connected to two N-type coupling regions of the tunneling capacitor of the first memory cell in each memory cell group in a column and the P-well where the tunneling capacitor is located, and one or two N-type coupling regions of the control capacitor of the second memory cell in each memory cell group in a column.

Programming of the memory cell of the present disclosure is performed at the gate oxide layer of the tunneling capacitor through Fowler-Nordheim (F-N) tunneling.

In addition, the memory cell group including two memory cells of the present disclosure can make it possible that under the same operating condition, one memory cell performs programming, while the other memory cell performs erasing. In this way, in a readout operation, one memory cell in the group may be used as a reference cell for the other cell for comparison and reading, so that the reliability of the reading is greatly improved. This is because the memory cell needs to be compared with a reference memory cell for reading, and a current value of the reference memory cell is usually 50% of a programming current value of the memory cell. In the memory cell group of the present disclosure, the current value of the memory cell used as the reference cell is a value of the memory cell itself. When one memory cell in the group is in a programming state, the other memory cell used as the reference cell is in an erasing state; and when one memory cell is in the erasing state, the other memory cell as the reference cell is in the programming state.

BRIEF DESCRIPTION OF THE DRAWINGS

The same numerals in the accompanying drawings denote the same or similar elements.

DETAILED DESCRIPTION

Figure 1:
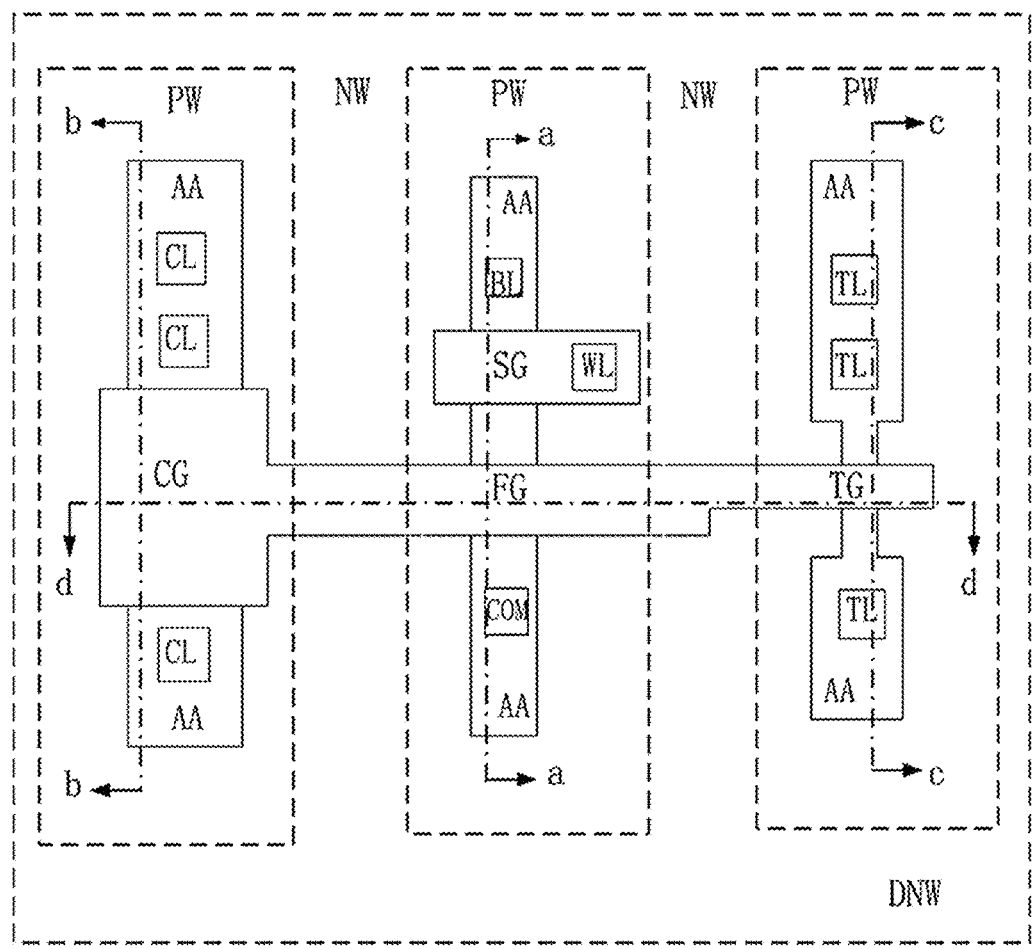
FIG. 1 is a top view of a non-volatile memory cell according to an embodiment of the present disclosure.

Specific implementations of the present disclosure can be clearly understood from the accompanying drawings and the following detailed description.

In a multi-time programmable erasable non-volatile memory cell described in the present disclosure, upper portions of a first P-well, a second P-well, and a third P-well or a first N-well each have a conventional active area (AA), and a control capacitor, a tunneling capacitor, and a floating-gate transistor are located in the active area in each P-well. The memory cell and the memory of the present disclosure are located on a P-type substrate.

The floating-gate transistor includes a floating gate, a gate oxide layer underneath the floating gate, and a source and a drain located in the active area. The gate oxide layer overlies a channel between the source and the drain and below the floating gate.

The floating gate of the floating-gate transistor and its underlying gate oxide layer extend from the third P-well or the first N-well where the floating-gate transistor is located along a direction perpendicular to the parallel direction of the parallel P-wells and N-well onto the control capacitor and the tunneling capacitor in the first P-well and the second P-well, respectively forming an upper plate and its underlying gate oxide layer of the control capacitor and the tunneling capacitor.

Both programming and erasing operations of the multi-time programmable erasable non-volatile memory cell described in the present disclosure are performed at the gate oxide layer in the tunneling capacitor through Fowler-Nordheim (F-N) tunneling. Compared with an existing memory cell that performs programming through channel hot electron injection into a floating gate, the multi-time programmable erasable non-volatile memory cell described in the present disclosure allows for programming through Fowler-Nordheim tunneling, which generates a very small current (measured in nA), thereby achieving low power consumption. In addition, the present disclosure also allows for erasing through Fowler-Nordheim tunneling, which provides high erasing efficiency.

In a programming operation, a sufficient voltage difference is applied on two sides of the gate oxide layer of the tunneling capacitor, to induce F—N tunneling, so that electrons inject to the floating gate. In an erasing operation, a reverse voltage difference is imposed on the two sides of the gate oxide layer at the tunneling capacitor, to induce F—N tunneling in a reverse direction, so that electrons are removed from the floating gate.

To facilitate F—N tunneling, for example, the gate oxide layer in the tunneling capacitor may have a smaller area than the gate oxide layer in the control capacitor. Further, the gate oxide layer has a smaller thickness than the gate oxide layer in the control capacitor.

The area of the gate oxide layer in the tunneling capacitor or the control capacitor is equal to the area of the upper plate in the capacitor, that is, a product of a dimension of the floating gate of the floating-gate transistor extending from the third P-well or the first N-well to the first P-well and the second P-well, in the active area where the capacitor is located, along the parallel direction of the parallel P-wells, and a dimension thereof along the normal direction of the parallel direction of the parallel P-wells.

In an embodiment, the area of the gate oxide layer in the control capacitor is greater than that of the gate oxide layer in the tunneling capacitor, and a ratio of the two areas ranges from 1.1:1.0 to 50:1.0, for example, ranges from 3.0:1.0 to 40:1.0, from 5.0:1.0 to 30:1.0, or from 7.0:1.0 to 20:1.0. In an embodiment, at the same time, the thickness of the gate oxide layer in the control capacitor is also greater than the thickness of the gate oxide layer in the tunneling capacitor, and a ratio of the two thicknesses ranges from 1.1:1.0 to 5.0:1.0, for example, from 1.5:1.0 to 4.5:1.0, from 2.0:1.0 to 4.0:1.0, or from 2.5:1.0 to 3.5:1.0.

The control capacitor and the tunneling capacitor in the memory cell described in the present disclosure each, for example, includes two N-type coupling regions in the P-well that are arranged on two sides of the upper plate. In this case, the capacitor is also a transistor.

In an embodiment, the memory cell of the present disclosure further includes a selection transistor located in the first P-well. The selection transistor and the floating-gate transistor are of the same type, for example, both are PMOS transistors or both are NMOS transistors. The selection transistor is connected in series with the floating-gate transistor. The selection transistor includes a selection gate and a gate oxide below the selection gate, and a source and a drain located in the active area, and the source of the selection transistor and the drain of the floating-gate transistor are a common terminal. The presence of the selection transistor can reduce operational interference, such as reading interference, to the floating-gate transistor.

In the present disclosure, both programming and erasing are performed at the gate oxide layer of the tunneling capacitor. A voltage difference sufficient to induce F—N tunneling is applied on opposite two sides of the gate oxide layer, to cause tunneling. The voltage difference in the programming operation is equal to or close to a value in the erasing operation, but is in a reverse direction therewith.

Specifically, for example, in the programming operation, a same potential is applied to the N-type coupling regions of the control capacitor, and/or the P-well where the control capacitor is located. In addition, a same potential is also applied to the N-type coupling regions of the tunneling capacitor and/or the P-well where the tunneling capacitor is located. The potentials applied to the two capacitors are reverse from each other. A capacitance value of the control capacitor is greater than that of the tunneling capacitor, so that the floating gate is coupled a co-directional potential from the N-type coupling regions of the control capacitor and/or the P-well thereof. The potential coupled to the floating gate and the potential of the N-type coupling regions of the tunneling capacitor and/or the P-well thereof are reverse from each other. Therefore, a voltage difference sufficient to induce F—N tunneling is formed on opposite two sides of the gate oxide layer of the tunneling capacitor, to induce tunneling, so that electrons inject to the floating gate, to perform programming. In an embodiment, the area of the gate oxide of the control capacitor is greater than that of the gate oxide of the tunneling capacitor, so that the capacitance of the control capacitor is greater than that of the tunneling capacitor.

In the erasing operation, the potential applied to the N-type coupling regions of the control capacitor and/or the P-well thereof is reverse from that for the programming; and the potential applied to the N-type coupling regions of the tunneling capacitor and/or the P-well where the tunneling capacitor is located is also reverse from that for the programming. Therefore, a reverse voltage difference to induce F—N tunneling is formed on opposite two sides of the gate oxide layer of the tunneling capacitor, so that the tunneling occurs. The voltage difference is in a reverse direction to that in the programming, so that electrons are withdrawn from the floating gate, to perform erasing.

At least one memory cell of the present disclosure may be arranged in multiple rows and columns with the same orientation and arrangement, to form a multi-time programmable erasable non-volatile memory apparatus. The direction of each of the columns is consistent with the parallel direction of the parallel P-wells in each of the memory cells, and the row and the column are perpendicular to each other. The first P-well, the second P-well, the third P-well or the first N-well, and the additional N-well sandwiched between two adjacent P-wells of the memory cell in each column merge respectively along the direction of the column. Deep N-wells of all memory cells merge together to form a single deep N-well and located in the P-type substrate. Each N-well is connected to the deep N-well. The memory array is built in the P-type substrate, and the substrate is grounded or at 0 V.

In an embodiment, the non-volatile memory apparatus further includes: a bit line, a common line, a control line, and a tunneling line, where the common line is connected to a source of each floating-gate transistor in a row of memory cells, the control line is connected to one or two N-type coupling regions of each control capacitor in a row of memory cells, and the tunneling line is connected to one or two N-type coupling regions of each tunneling capacitor in a column of memory cells; in the absence of a selection transistor in the apparatus, the bit line is connected to a drain of each floating-gate transistor in a column of memory cells; and in the presence of the selection transistor in the apparatus, the bit line is connected to a drain of each selection transistor in a column of memory cells, in which case there is further a word line connected to a gate of each selection transistor in a row of memory cells.

In an embodiment, the control line is connected to two N-type coupling regions of each control capacitor in a row of memory cells and the first P-well where the control capacitor is located, and the tunneling line is connected to two N-type coupling regions of each tunneling capacitor in a column of memory cells and the second P-well where the tunneling capacitor is located. This facilitates more effective tunneling induction.

Each memory cell in the array can perform erasing or programming independently. Therefore, the memory array can be used to form a large electrically erasable programmable erasable memory (EEPROM). Alternatively, the memory array may form a flash memory by means of erasing or programming of the cells within the array together.

The present disclosure further relates to a multi-time programmable erasable non-volatile memory cell group, including: two memory cells of the present disclosure, namely, the first memory cell and second memory cell, where for each of the two cells, a third P-well or a first N-well where a floating-gate transistor is located is located between a first P-well and a second P-well; where two floating-gate transistors in the two cells share one source, and a control capacitor and a tunneling capacitor in the first memory cell share one N-type coupling region with a tunneling capacitor and a control capacitor in the second memory cell, respectively; and wherein deep N-wells of the two cells merge together, the first P-well and second P-well in the first memory cell merge with the second P-well and the first P-well in the second memory cell, respectively; and the third P-well or the first N-well in the first memory cell merge with that in the second memory cell, and an additional N-well sandwiched between two adjacent P-wells in the first memory cell also merge with that sandwiched between two adjacent P-wells in the second memory cell.

Either of the memory cells in the group may be referred to as the first memory cell. When one memory cell is referred to as the first memory cell, the other memory cell is referred to as the second memory cell.

In an embodiment, both the memory cells in the memory cell group perform programming and erasing operations at gate oxides of their tunneling capacitors through Fowler-Nordheim tunneling.

In this way, the control capacitor and the tunneling capacitor in the first memory cell share one N-type coupling region with the tunneling capacitor and the control capacitor in the second memory cell, respectively; and therefore it is possible that under the same operating condition, the first memory cell performs programming, while the second memory cell performs erasing; or under the same operating condition, the first memory cell performs erasing, while the second memory cell performs programming. In this way, in a reading operation, one memory cell in the group may be used as a reference cell for the other cell for comparison and reading, so that the reliability of the reading is greatly improved.

In this case, in each memory cell of the group, the area of the gate oxide layer in the tunneling capacitor is less than that of the gate oxide layer in the control capacitor. Further, at the same time, the thickness of the gate oxide layer in the tunneling capacitor is also less than that of the gate oxide layer in the floating-gate transistor.

For a range of the ratio of the area of the gate oxide layer in the control capacitor to that of the gate oxide layer in the tunneling capacitor, and a range of the ratio of the thickness of the gate oxide layer in the control capacitor to that of the gate oxide layer in the tunneling capacitor, refer to the applicable ranges described above for a single memory cell.

In an embodiment, the structure and components of the first memory cell in the memory cell group are the same as those of the second memory cell in the memory cell group.

The present disclosure further relates to a multi-time programmable erasable non-volatile memory apparatus fabricated on a P-type substrate, the memory apparatus including: at least one memory cell group described above, where deep N-wells of all memory cell groups merge to form a single deep N-well and is located in the P-type substrate; all the memory cell groups are arranged in multiple rows and columns with the same orientation and arrangement, and the direction of the column is consistent with the parallel direction of the parallel P-wells in the memory cell; and the P-wells and the N-wells of the memory cell groups in each column merge respectively along the direction of the column.

In an embodiment, the non-volatile memory apparatus further includes: a bit line, a common line, a control line, and a tunneling line, where the common line is connected to the common source of two floating-gate transistors in each memory cell group in a row, the control line is connected to one or two N-type coupling regions of the control capacitor of the first memory cell and one or two N-type coupling regions of the tunneling capacitor of the second memory cell in each memory cell group in a row; the tunneling line is connected to one or two N-type coupling regions of the tunneling capacitor of the first memory cell and one or two N-type coupling regions of the control capacitor of the second memory cell in each memory cell group in a column; in the absence of a selection transistor in the apparatus, the bit line is connected to drains of two floating-gate transistors in each memory cell group in a column; and in the presence of the selection transistor in the apparatus, the bit line is connected to drains of two selection transistors in each memory cell group in a column, in which case there is further a word line connected to gates of two selection transistors in each memory cell group in a row.

In an embodiment, the control line is connected to two N-type coupling regions of a control capacitor of a first memory cell in each memory cell group in a row and a P-well where the control capacitor is located, and two N-type coupling regions of a tunneling capacitor of a second memory cell in each memory cell group in a row and a P-well where the tunneling capacitor is located; and the tunneling line is connected to two N-type coupling regions of the tunneling capacitor of the first memory cell in each memory cell group in a column and the P-well where the tunneling capacitor is located, and one or two N-type coupling regions of the control capacitor of the second memory cell in each memory cell group in a column.

The memory cell group including two memory cells of the present disclosure stores one bit of data. Compared with a single memory cell storing one bit of data, although the memory cell group has a slightly larger area, the operations are simple and convenient, and therefore the efficiency and reading reliability are greatly improved.

An array is formed by the memory cell groups described above, each of which can perform erasing or programming independently. Therefore, the memory array can be used to form a large electrically erasable programmable memory (EEPROM). Alternatively, the memory array may form a flash memory by means of erasing or programming of the cell groups within the array together.

The memory cell and the memory of the present disclosure can be fabricated using conventional standard logic processes, for example, standard logic processes of 180 nm, 130 nm, 110 nm, etc.

In the memory cell, the area of the gate oxide layer in the control capacitor and the area of the gate oxide layer in the tunneling capacitor may be different. The area of the gate oxide layer in each of the control capacitor and the tunneling capacitor is the same as the area of the upper plate, which depends on a pattern size of the floating gate on the active area in the well where the capacitor is located. The pattern sizes can be formed by a conventional method commonly used in the industry. For example, the pattern size of the floating gate on the active area where the control capacitor or the tunneling capacitor is located is generated by its corresponding mask plate through photoetching and dry etching, and the shape and dimension of the pattern size are designed and defined in the layout.

The thickness of the gate oxide layer in the control capacitor and the thickness of the gate oxide layer in the tunneling capacitor may also be different, which are also formed by a growth method commonly used in the industry. For example, when the thickness of the gate oxide layer in the control capacitor is greater than the thickness of the gate oxide layer in the tunneling capacitor, a thermal oxidation method is used to first grow a layer of gate oxide, to reach a thickness 1, in regions where the gate oxide layer in the control capacitor and the gate oxide layer in the tunneling capacitor are to be grown, and the thickness 1 is a difference between the thickness of the gate oxide layer in the control capacitor and that of the gate oxide layer in the tunneling capacitor. Then, in the region where the gate oxide layer in the tunneling capacitor is to be grown, the grown gate oxide layer is completely removed by a wet method; and then, a new layer of gate oxide is formed in both the gate oxide areas by the thermal oxidation method, to reach the required thickness of the gate oxide in the tunneling capacitor.

The present disclosure is described in detail below with reference to the specific embodiments in the accompanying drawings. The specific examples in the accompanying drawings are used only to illustrate and help understand the technical solutions of the present disclosure, and do not constitute a limitation on the scope of protection of the present disclosure. Without departing from the essence and scope of the present disclosure, those of ordinary skill can make structural, logical, and electrical modifications to the following specific embodiments and apply them to other embodiments. These all fall within the scope of protection of the present disclosure.

In addition, although the embodiments and the accompanying drawings provide specific voltage values, it should be understood that these values are not necessarily exact values, but are used to express the general concept of a biasing scheme.

According to the embodiments of the present disclosure, a non-volatile memory cell is provided, where tunneling for programming and erasing may be performed at the gate oxide layer in the tunneling capacitor. The area of the gate oxide layer in the control capacitor is greater than that of the gate oxide layer in the tunneling capacitor, and a ratio of the two areas ranges from 8:1 to 10:1. A thickness of the gate oxide layer in the control capacitor is the same as that of the gate oxide layer in the tunneling capacitor, which is a thickness of a gate oxide layer in a conventional transistor. The cell is fabricated using a 130 nm logic process.

FIG. 1 is a top view of the non-volatile cell. FIG. 2 to FIG. 5 are sectional views of the memory cell along section lines a-a, b-b, c-c, and d-d, respectively.

As can be seen from FIG. 1 to FIG. 5, the non-volatile memory cell is fabricated on a P-type silicon substrate. A deep N-well (DNW) is arranged in the P-substrate, to electrically isolate the memory cell from the substrate. Three P-wells (PW) are separated by two N-wells (NW), and the five wells are arranged in parallel in the deep N-well. The P-wells on both sides are the first P-well and the second P-well, respectively, and the P-well in the middle is the third P-well.

Figure 5:
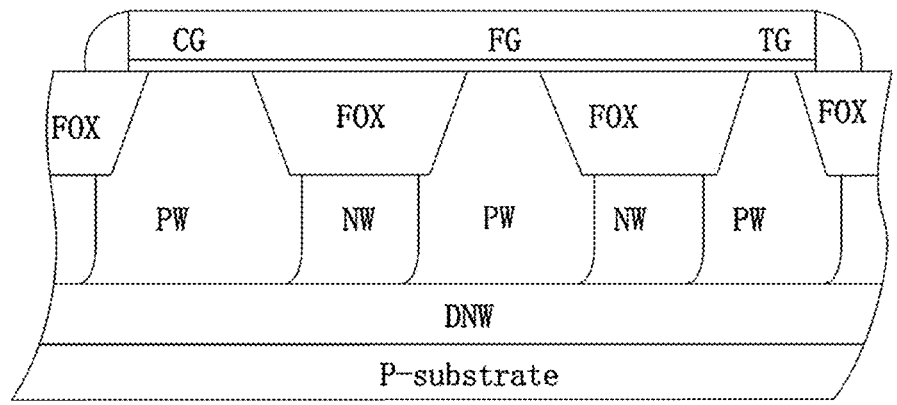

An upper portion of each P-well has an active area (AA). An NMOS floating-gate transistor is connected in series with an NMOS selection transistor and is arranged on the active area (AA) of the middle third P-well. An NMOS control capacitor transistor and an NMOS tunneling capacitor transistor are arranged on the active areas (AAs) of the first P-well and the second P-well on both sides, respectively. The transistors are surrounded by shallow trenches, which are filled with a thick field oxide (FOX), as shown in FIG. 5.

Figure 2:
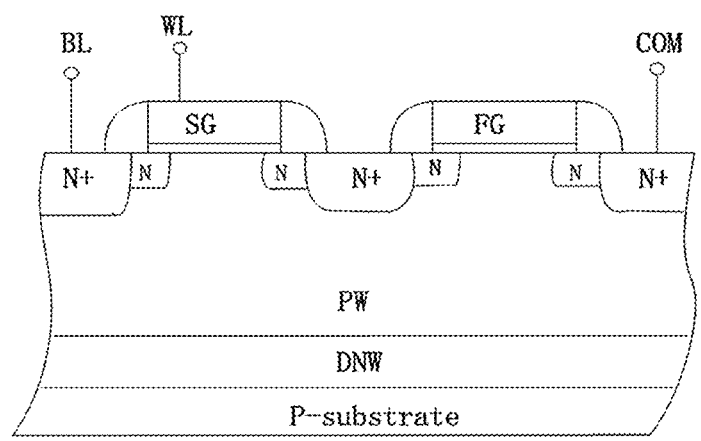
FIG. 2 to FIG. 5 are sectional views of the memory cell in the embodiment shown in FIG. 1 along section lines a-a, b-b, c-c, and d-d, respectively.

FIG. 2 is a sectional view of the floating-gate transistor and the selection transistor along the section line a-a.

As shown in FIG. 1 and FIG. 2, the floating-gate transistor includes a floating gate (FG) and a gate oxide layer below the floating gate, which are located on the active area (AA); and further includes an N-type drain and source, which are located in the active area (AA). The drain and the source each include a lightly-doped N region and a heavily-doped N+ contact region. The floating gate (FG) is a conductively-doped polysilicon gate, which is arranged on the top of the gate oxide layer. The gate oxide layer is located below the floating gate and above the channel between the drain and source.

The selection transistor includes a selection gate (SG) and a gate oxide layer below the selection gate, which are located on the active area (AA); and further includes an N-type drain and source, which are located in the active area (AA). The drain and the source each include a lightly-doped N region and a heavily-doped N+ contact region. The N+ contact region of the source of the selection transistor is shared with the N+ contact region of the drain of the floating-gate transistor. The selection gate is also a polysilicon gate.

Figure 3:
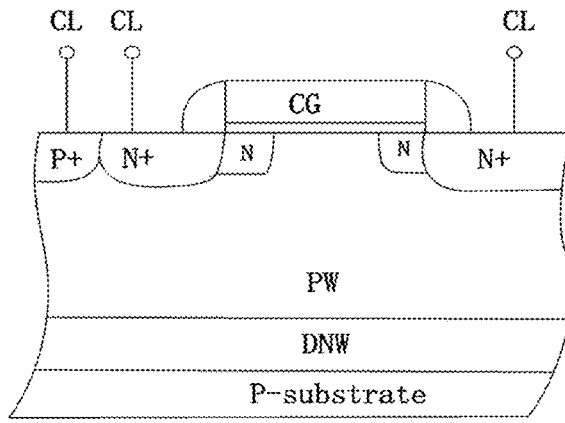
Figure 4:
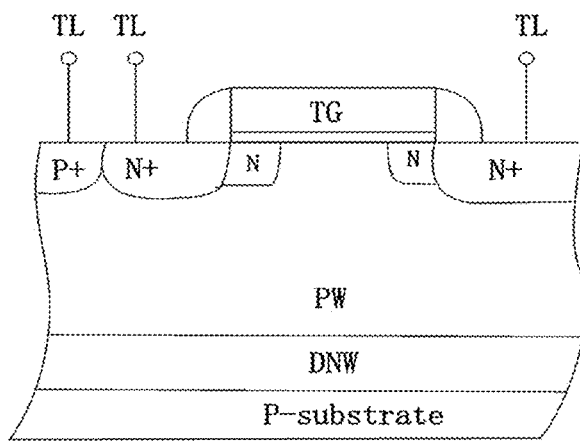

As shown in FIG. 2 to FIG. 4, the floating gate and the selection gate are surrounded by a sidewall spacer, which is usually formed by silicon nitride or silicon oxide. When the N+ or P+ region is formed, the sidewall spacer layer prevents injected N+ or P+ substance from entering the lightly-doped N region or P region.

FIG. 3 and FIG. 4 are respectively sectional views of the control capacitor and the tunneling capacitor along the section lines b-b and c-c.

As shown in FIG. 1, and FIG. 3 and FIG. 4, the control capacitor includes an upper plate (CG) and a gate oxide layer below the upper plate, which are located on the active area (AA). The tunneling capacitor includes an upper plate (TG) and a gate oxide layer below the upper plate, which are located on the active area (AA). The upper plate and the gate oxide layer of each of the two capacitors are formed by extending the floating gate and the gate oxide layer below the floating gate of the floating-gate transistor across the N-well along a direction perpendicular to the parallel direction of the parallel P-wells and N-well, to completely cover the active area in the P-well where each of the two capacitors is located.

The area of the gate oxide layer in each of the control capacitor and the tunneling capacitor is equal to the area of the upper plate thereof.

As shown in FIG. 1, a length of the upper plate (TG) of the tunneling capacitor along the parallel direction of the parallel P wells is less than that of the upper plate of the control capacitor; and a dimension of an intersection region of the active area in the P-well where the tunneling capacitor is located and the upper plate of the capacitor along the normal direction of the parallel direction of the parallel P-wells is less than that of the other regions of the active area and is also less than that of the control capacitor. In this way, the area of the upper plate in the tunneling capacitor is less than that of the upper plate in the control capacitor, so as to facilitate tunneling at the gate oxide layer of the tunneling capacitor.

Each of the control capacitor and the tunneling capacitor includes two N-coupling regions, which are located in the active area of the P-well where the capacitor is located. Each N-type coupling region, for example, includes a lightly-doped N region and a heavily-doped N+ contact region. As shown in FIG. 3 and FIG. 4, next to a heavily-doped N+ contact region of each of the two capacitors, there is further a P-type P+ contact region, which is connected to each of the first P-well and the second P-well where the capacitor is located for controlling a potential of each of the first P-well and the second P-well.

As shown in FIG. 1 to FIG. 4, a drain of the selection transistor is connected to a bit line (BL), and a selection gate (SG) of the selection transistor is connected to a word line (WL). A source of the floating-gate transistor is connected to a common line (COM). By controlling a selection gate voltage by the word line (WL), the selection transistor can be turned on or off, thereby connecting or disconnecting the floating-gate transistor to or from the bit line (BL).

The two N-coupling regions (e.g., the N+ contact regions) of the control capacitor are connected to a control line (CL), and the two N-coupling regions (e.g., the N+ contact regions) of the tunneling capacitor are connected to a tunneling line (TL). A P+ contact region next to one N+ contact region of the control capacitor is also connected to the control line (CL), to facilitate applying a potential to the first P-well where the control capacitor is located. A P+ contact region next to one N+ contact region of the tunneling capacitor is also connected to the tunneling line (TL), to facilitate applying a potential to the second P-well where the tunneling capacitor is located.

In most applications, a plurality of non-volatile cells are put together to form a memory array.

Figures 6, 7:
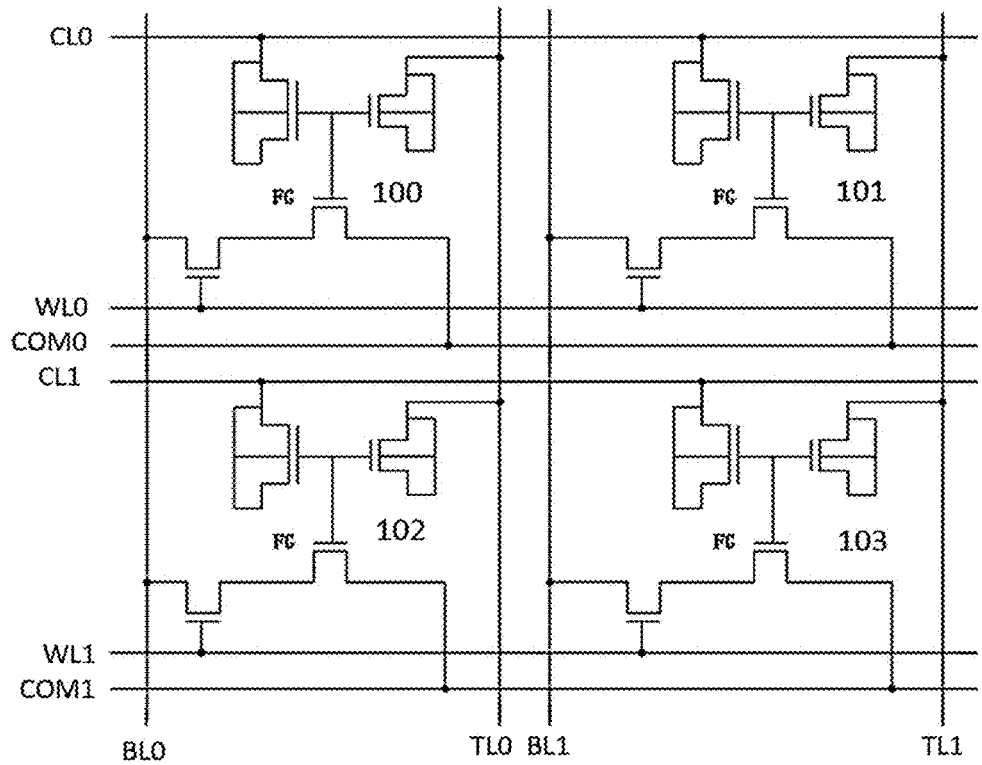
FIG. 6 shows an array of 2 rows by 2 columns of memory cells shown in FIG. 1.
FIG. 7 shows bias voltage signals connected during different operation periods of the array shown in FIG. 6.

For description by way of example, FIG. 6 and FIG. 7 describe and show a 2×2 memory array formed by memory cells shown in FIG. 1 to FIG. 5 and operations of the memory array.

The array includes four memory cells arranged in 2 rows by 2 columns. By increasing and/or decreasing the number of rows and/or columns, arrays of different sizes can be formed. The memory array includes memory cells 100, 101, 102, and 103.

In an embodiment, a WL of the memory cells 100 and 101 is connected to WL 0, a common line (COM) is connected to COM 0, and a control line (CL) is connected to CL 0, to form a memory row. A WL of the memory cells 102 and 103 is connected to WL 1, a common line (COM) is connected to COM 1, and a control line (CL) is connected to CL 1, to form another memory row. A bit line (BL) and a tunneling line (TL) of the cells 100 and 102 are connected to BL 0 and TL 0, respectively, to form a memory column. Similarly, a bit line (BL) and a tunneling line (TL) of the cells 101 and 103 are connected to BL 1 and TL 1, respectively, to form another memory column.

First P-wells, second P-wells, third P-wells, and two N-wells therebetween of memory cells in a memory column merge together respectively along the direction of the column. Therefore, each memory column includes three P-wells and two N-wells. Each N-well is connected to deep N-well, and deep N-wells of all the memory cells in the array merge to form a single deep N-well. The memory array is fabricated in the P-type substrate, and the substrate is grounded or at 0 V.

FIG. 7 shows bias voltages of the memory array shown in FIG. 6 in different operating modes.

Vpp is a positive high voltage, and Vnn is a negative high voltage. For a memory element fabricated by 5 V process, Vpp ranges from 7 V to 8 V, Vnn ranges from −7 V to −8 V, VDD is 5 V, and Vrd ranges from 2.5 V to 3.3 V; and for a memory element fabricated by 3.3 V process, Vpp ranges from 5 V to 6 V, Vnn ranges from −5 V to −6 V, VDD is 3.3 V, and Vrd ranges from 1.5 V to 2.5 V.

A memory cell may be designated to perform program or erase independently. For example, the memory cell 100 may be designated to perform programming and erasing. Programming is performed for the memory cell 100 by driving CL 0 potential to Vpp and TL 0 potential to Vnn. COM 0 potential is 0 V, and BL 0 and WL 0 are floated.

When the potential of the control line (CL) 0 connected to the N+ contact region of the control capacitor is driven to the high positive potential Vpp, the potential of the first P-well is also driven to Vpp through the P+ contact region of the first P-well. The area of the gate oxide layer in the control capacitor is greater than that of the gate oxide layer in the tunneling capacitor, and therefore the floating gate is coupled to a positive high potential from the N-coupling regions of the control capacitor and the first P-well, and the positive high potential is applied to the upper plate of the tunneling capacitor in the second P-well. In addition, when the potential of the TL 0 connected to the two N+ contact regions of the tunneling capacitor is driven to the negative high potential Vnn, the potential of the second P-well is also driven to Vnn through the P+ contact region of the second P-well. Therefore, above the gate oxide layer in the tunneling capacitor, the upper plate has a positive high potential; and below the gate oxide layer, the N+ contact region and the second P-well have the negative high potential Vnn. On opposite two sides of the gate oxide layer in the tunneling capacitor, a strong voltage difference is formed, to induce tunneling, so that electrons are tunneled to the upper plate of the tunneling capacitor, to perform programming.

The N+ contact region of the tunneling capacitor of the memory cell 101 is connected to the TL 1, and its potential is 0, and the potential of the second P-well where the tunneling capacitor is located is also driven to 0. Although the potential of the CL 0 connected to the N+ contact region of the control capacitor is the positive high potential Vpp, and the potential of the first P-well where the control capacitor is located is also driven to the positive high potential Vpp, no strong voltage difference that induces tunneling can be formed on two sides of the gate oxide layer in the tunneling capacitor. Therefore, programming cannot be performed.

The N+ contact region of the control capacitor of the memory cell 102 is connected to the CL 1, and its potential is 0 v, and the potential of the first P-well where the control capacitor is located is also driven to 0 v. Although the potential of the TL 0 connected to the N+ contact region of the tunneling capacitor is Vnn, and the potential of the second P-well where the tunneling capacitor is located is also driven to Vnn, no strong voltage difference that induces tunneling can be formed on two sides of the gate oxide layer in the tunneling capacitor, and programming cannot be performed.

The N+ contact region of the control capacitor of the memory cell 103 is connected to the CL 1, and its potential is 0 v, and the potential of the first P-well where the control capacitor is located is also driven to 0 v. The potential of the TL 1 connected to the N+ contact region of the tunneling capacitor is 0 v, and the potential of the second P-well where the tunneling capacitor is located is driven to 0 v. Therefore, no strong voltage difference that induces tunneling can be formed on two sides of the gate oxide layer of the tunneling capacitor, and programming cannot be performed.

When the memory cells 100, 101, 102, and 103 perform erasing, the applied operating potential values are reverse from their respective values during programming.

For example, the potential of the CL 0 connected to the N+ contact region of the control capacitor of the memory cell 100 and the first P-well are the negative high potential Vnn, and the potential of the TL 0 connected to the N+ contact region of the tunneling capacitor and the second P-well are the positive high potential Vpp. Therefore, on opposite two sides of the gate oxide layer in the tunneling capacitor, a strong voltage difference reverse from that of the programming is formed, which induces tunneling, so that electrons are withdrawn from the upper plate of the tunneling capacitor and tunneled to the second P-well.

A strong voltage difference that can induce tunneling cannot be formed on two sides of the gate oxide layer in the capacitor for all the memory cells 101, 102, and 103, and erasing cannot be performed.

In a reading operation, for the memory cell 100, the word line (WL) thereof is driven to VDD, the bit line (BL) thereof is driven to Vrd, and the selection transistor is turned on. During programming of the memory cell 100, there are electrons in the floating gate, which has a negative potential, and the NMOS floating-gate transistor cannot be turned on. Therefore, the potential of the bit line (BL) remains unchanged, and no current is generated between the drain of the selection transistor (connected to the BL) and the source of the floating-gate transistor (connected to the COM). A sense amplifier receives a current of 0, compares the current with a current value of the reference memory cell, and performs sense amplification, to output a data signal of a state "1".

During erasing of the memory cell 100, electrons are withdrawn from the floating gate, which then has a positive potential, and the NMOS floating-gate transistor is turned on. The selection transistor is also in an "on" state, and a current is generated between the drain of the selection transistor (connected to the BL) and the source of the floating-gate transistor (connected to the COM). A sense amplifier receives a current, compares the current value with a current value of the reference memory cell, and performs sense amplification, to output a data signal of a state "0".

The bit lines (BLs) of the memory cells 101 and 103 are floated, and there is no readout signal. The selection transistor 102 of the memory cell is turned off, and there is no readout signal.

Figure 8:
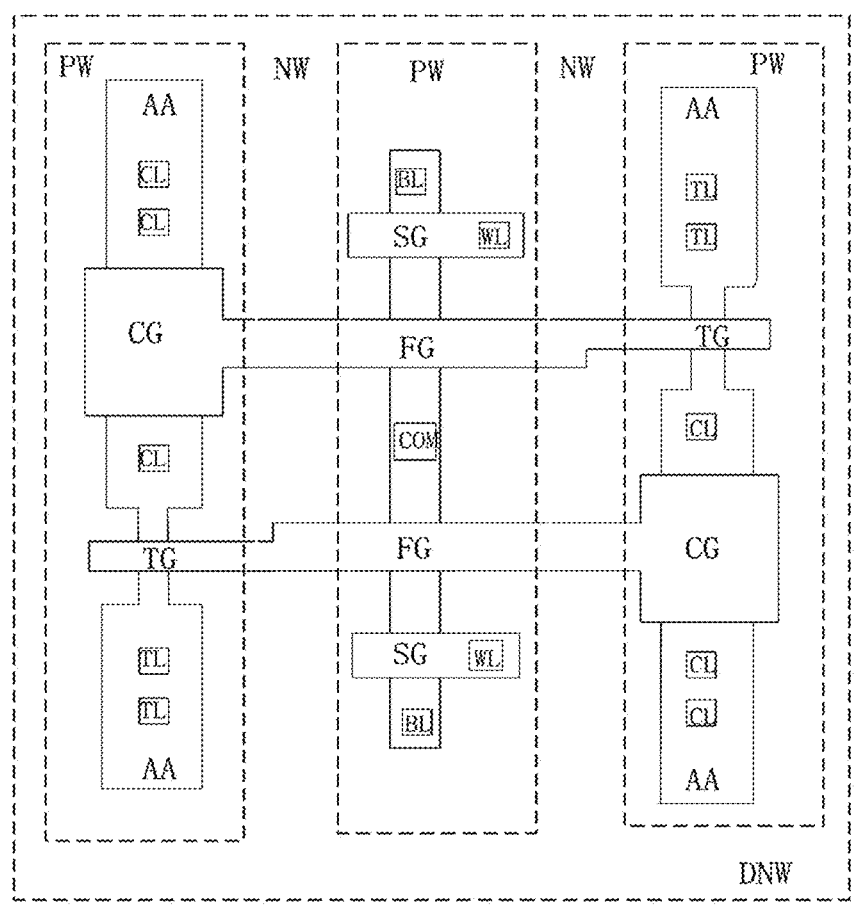
FIG. 8 is a top view of a memory cell group according to an embodiment of the present disclosure.

FIG. 8 shows a memory cell group, including two memory cells as shown in FIG. 1. Two floating-gate transistors in the two cells share one source, and a control capacitor and a tunneling capacitor in one memory cell share one N-type coupling region with a tunneling capacitor and a control capacitor in the other memory cell, respectively. Deep N-wells of the two cells merge together, a first P-well and a second P-well in one memory cell merge with a second P-well and a first P-well in the other memory cell, respectively; and a third P-well or a first N-well in the first memory cell merge with that in the second memory cell, and an additional N-well sandwiched between two adjacent P-wells in the first memory cell merges with that sandwiched between two adjacent P-wells in the second memory cell.

In the group shown in FIG. 8, the memory cell in the upper portion may be referred to as the first memory cell, and the other memory cell (shown in the lower portion) is referred to as the second memory cell.

Structures and components of the two cells are the same respectively. The area and thickness of the gate oxide layer in the control capacitor and the area and thickness of the gate oxide layer in the tunneling capacitor are both the same in the two cells.

Both programming and erasing of the two cells are performed through tunneling at the respective gate oxide layers in the tunneling capacitors. In this way, when one cell in the group performs programming, the other cell performs erasing simultaneously. Therefore, in a reading operation, one memory cell in the group may be used as a reference cell for the other cell for comparison and readout, so that the reliability of the reading is improved.

Connection manners of bit line (BL), word line (WL), common line (COM), control line (CL), and tunneling line (TL) of each cell in the memory cell group are the same as those of the single memory cell described above.

Figure 9:
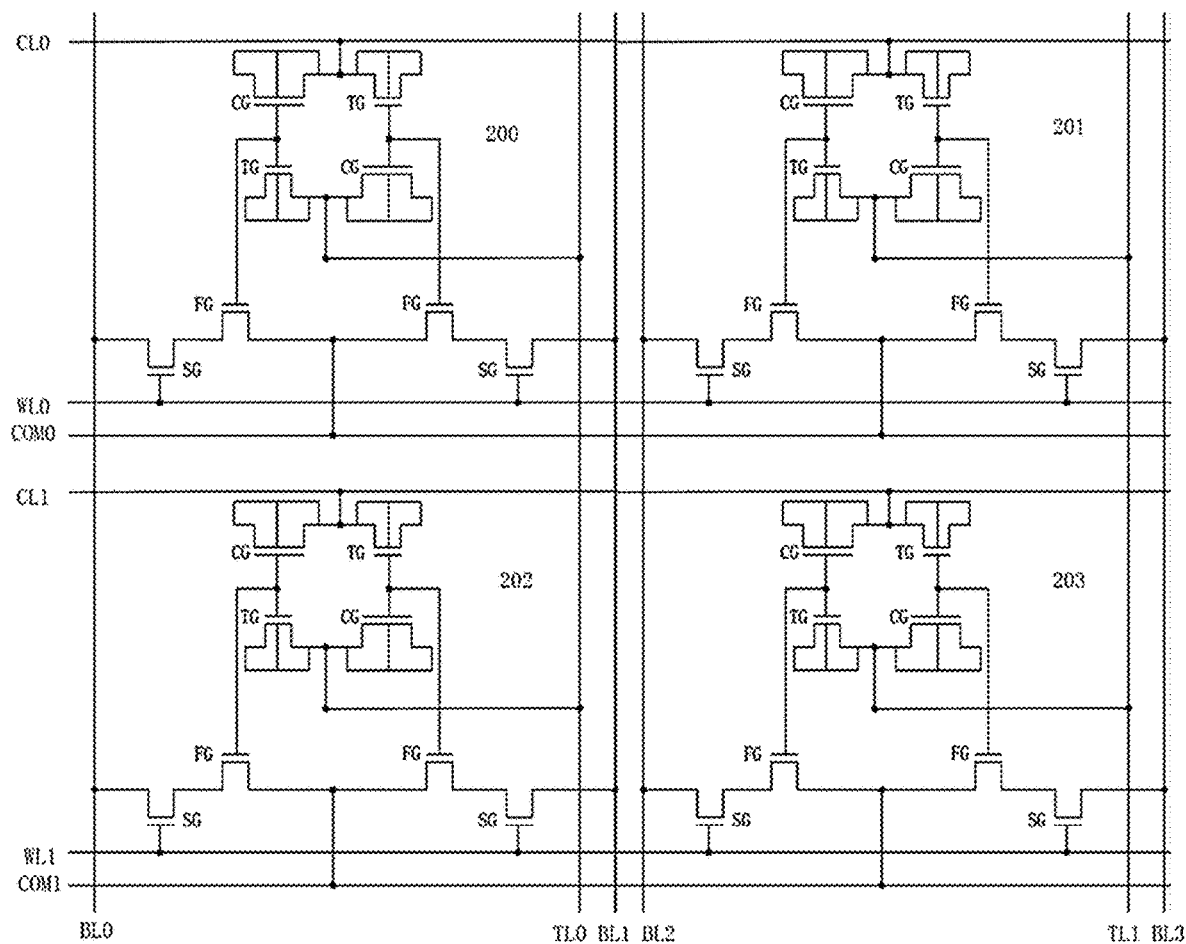
FIG. 9 shows an array of 2 rows by 2 columns of memory cell groups shown in FIG. 8.

FIG. 9 shows four memory cell groups as shown in FIG. 8, which are arranged in 2 rows by 2 columns. In each memory cell group in FIG. 9, the left half circuit diagram is of the first memory cell, and the right half circuit diagram is of the second memory cell.

As shown in FIG. 9, in each group, two N-type coupling regions of a control capacitor and a P+ contact region of a first P-well of the control capacitor of the first memory cell, and two N-type coupling regions of a tunneling capacitor and a P+ contact region of a second P-well of the tunneling capacitor of the second memory cell are all connected to a control line (CL); and two N-type coupling regions of a tunneling capacitor and a P+ contact region of a second P-well of the tunneling capacitor of the first memory cell, and two N-type coupling regions of a control capacitor and a P+ contact region of a first P-well of the control capacitor of the second memory cell are all connected to a tunneling line (TL). Drains of two selection transistors in each group are respectively connected to two bit lines (BLs); and gates of the two selection transistors are connected to a word line (WL). A common source of two floating-gate transistors is connected to a common line (COM).

A differential sense amplifier is connected to two bit lines of each memory cell group. A differential circuit in the amplifier may set that the operation of one memory cell (for example, the first memory cell) in each group serves as the corresponding type operation of the group, and that the operation of the other memory cell serves as the operation of reference memory cell. During programming, erasing, and reading operations, the amplifier receives signals from the two memory cells, performs comparison and amplification, and then outputs a signal reflecting the operation of the group.

During programming of the first memory cell in the group, electrons inject to the floating gate through tunneling, the NMOS floating-gate transistor cannot be turned on, and no current is generated between the drain of the selection transistor (connected to the BL) and the source of the floating-gate transistor (connected to the COM). At the same time, the second memory cell as the reference memory cell performs erasing, electrons in the floating gate are removed, the NMOS floating-gate transistor is turned on, the selection transistor is also turned on, and a current is generated between the drain of the selection transistor (connected to the BL) and the source of the floating-gate transistor (connected to the COM), and the current is input to the differential amplifier as the current of the reference memory cell. The amplifier receives a current of "0" of the first memory cell and compares with the current value of the second memory cell, and after amplification, outputs a data signal of state "1".

When the first memory cell in the group performs erasing, electrons in the floating gate are withdrawn through tunneling, the NMOS floating-gate transistor is turned on, the selection transistor is also turned on, and a current is generated between the drain of the selection transistor (connected to the BL) and the source of the floating-gate transistor (connected to the COM). At the same time, the second memory cell as the reference memory cell performs programming, the floating-gate transistor is not turned on, no current is generated between the drain of the selection transistor (connected to the BL) and the source of the floating-gate transistor (connected to the COM), and a current value of the reference memory cell is 0. The differential amplifier receives and compares the currents of the two cells, and after sense amplification, outputs a data signal of state "0".

FIG. 9 shows an array, including four memory cell groups shown in FIG. 8, which are arranged in 2 rows by 2 columns. The memory array includes memory cell groups 200, 201, 202, and 203. By increasing and/or decreasing the number of rows and/or columns, arrays of different sizes can be formed.

In an embodiment, CL, WL, and COM of the memory cell groups 200 and 201 are connected to CL 0, WL 0, and COM 0, respectively, to form a memory row, and CL, WL, and COM of the memory cell groups 202 and 203 are connected to CL 1, WL 1, and COM 1, respectively, to form another memory row. Two bit lines (BLs) and a tunneling line (TL) of each of the cell groups 200 and 202 are connected to BL 0, BL 1, and TL 0, respectively, to form a memory column. Similarly, two bit lines (BLs) and a tunneling line (TL) of each of the cell groups 201 and 203 are connected to BL 2, BL 3, and TL 1, respectively, to form another memory column. The differential amplifier is connected to two bit lines of each memory cell group.

The left half circuit diagram of each cell group is the first memory cell, and the right half circuit diagram is the second memory cell. The differential amplifier sets that the programming and erasing operations of the first memory cell in each group serve as respectively the programming and erasing operations of the memory cell group, and that operations of the second memory cell serve as operations of the reference memory cell.

A specified memory cell group may be designated to perform program or erase independently.

For example, the memory cell group 200 is designated to perform programming, erasing, and reading, that is, the first memory cell in the memory cell group 200 performs programming, erasing, and reading.

In these operations, settings of bias voltage signals of the first memory cells of the four memory cell groups 200, 201, 202, and 203 are the same as those of the memory cells 100, 101, 102, and 103 in FIG. 7, respectively. Programming, erasing, and reading operations of the first memory cells in these groups are also the same as those of the memory cells 100, 101, 102, and 103, respectively, as described above. That is, only the first memory cell in the memory cell group 200 can perform programming and erasing. The first memory cells in the other groups cannot perform programming and erasing.

The second memory cell in the memory cell group 200 performs a reverse operation along with the first memory cell. That is, when the first memory cell performs programming, the second memory cell performs erasing; and when the first memory cell performs erasing, the second memory cell performs programming.

In a reading operation, the differential sense amplifier is connected to the two bit lines of the two cells in the cell group 200, receives and compares current values input from the two cells, and outputs a data signal after sense amplification.

During programming of the first memory cell in the group 200, electrons inject to the floating gate, the NMOS floating-gate transistor cannot be turned on, and no current is generated between the drain of the selection transistor (connected to the BL) and the source of the floating-gate transistor (connected to the COM). At the same time, the second memory cell performs erasing, electrons in the floating gate are removed, the NMOS floating-gate transistor and the selection transistor both are turned on, and a current is generated between the drain of the selection transistor (connected to the BL) and the source of the floating-gate transistor (connected to the COM), and the current is input to the differential sense amplifier as the current of the reference memory cell. The amplifier receives a current of "0" of the first memory cell and compares with the current value of the second memory cell, and after sense amplification, outputs a data signal of state "1".

During erasing of the first memory cell in the group 200, electrons in the floating gate are withdrawn through tunneling, the NMOS floating-gate transistor and the selection transistor both are turned on, and a current is generated between the drain of the selection transistor (connected to the BL) and the source of the floating-gate transistor (connected to the COM). At the same time, the second memory cell as the reference memory cell performs programming, the floating-gate transistor is not turned on, no current is generated between the drain of the selection transistor (connected to the BL) and the source of the floating-gate transistor (connected to the COM), and current value of the reference memory cell is 0. The differential amplifier receives and compares the current values of the two cells, and after sense amplification, outputs a data signal of state "0".

The other memory cell groups 201, 202, and 203 have no readout signals.

In present disclosure, in the reading operation, for a single memory cell and an array thereof, the current value of reference memory cell can usually reach only 50% of the programming current value of the memory cell. In the memory cell group and the array thereof, the second memory cell serves as the reference memory cell, and the current value output is 100% of the programming current value of the memory cell. Therefore, the readout reliability of the memory cell group and the array thereof is greatly improved.

What is claimed is:

1. A multi-time programmable non-volatile memory cell, comprising:
   a deep N-well, and
   a first P-well, a second P-well, and a third P-well or a first N-well, which are located in parallel to each other in the deep N-well, wherein:
   a control capacitor and a tunneling capacitor are located in the first P-well and the second P-well, respectively, and each of the control capacitor and the tunneling capacitor comprises one or two N-type coupling regions in the P-well;
   one floating-gate transistor is located in the third P-well or the first N-well, the floating-gate transistor comprising a polysilicon floating gate and its underlying gate oxide; and
   the floating gate of the floating-gate transistor and its gate oxide extend along a direction perpendicular to the parallel P-wells to cover the control capacitor and the tunneling capacitor in the first P-well and the second P-well, respectively forming an upper plate and a gate oxide of the control capacitor and the tunneling capacitor.

2. The non-volatile memory cell of claim 1, wherein the memory cell performs programming and erasing operations at the gate oxide of the tunneling capacitor through Fowler-Nordheim tunneling.

3. The non-volatile memory cell of claim 2, wherein an area of the gate oxide layer in the control capacitor is larger than that of the gate oxide layer in the tunneling capacitor, and a ratio of the two areas ranges from 1.1:1.0 to 50:1.0.

4. The non-volatile memory cell of claim 1, wherein each of the control capacitor and the tunneling capacitor is a transistor, and comprises two N-type coupling regions in the P-well that are arranged on both sides of the upper plate.

5. The non-volatile memory cell of claim 1, wherein the floating-gate transistor is an NMOS transistor located in the third P-well.

6. The non-volatile memory cell of claim 5, wherein the third P-well is located between the first P-well and the second P-well, or on one side of the first P-well and the second P-well, and two adjacent ones of the three P-wells are separated by an additional N-well that is not the first N-well.

7. The non-volatile memory cell of claim 1, wherein the floating-gate transistor is a PMOS transistor located in the first N-well, and the first N-well is located between the first P-well and the second P-well, or on one side of the first P-well and the second P-well; and when the first N-well is located on one side of the first P-well and the second P-well, the first P-well and the second P-well are separated by an additional N-well that is not the first N-well.

8. The non-volatile memory cell of claim 1, further comprising one selection transistor located in the well where the floating-gate transistor is located and connected in series with the floating-gate transistor, wherein the selection transistor comprises a selection gate and its underlying gate oxide, a source, and a drain, the floating-gate transistor also comprises a source and a drain, and the source of the selection transistor and the drain of the floating-gate transistor are a common terminal.

9. A multi-time programmable non-volatile memory device built on a P-type substrate, the memory device comprising: at least one non-volatile memory cell of claim 1, wherein deep N-wells of all memory cells are combined as a whole and located in the P-type substrate; all the memory cells are arranged in multiple rows and columns with the same orientation and arrangement, and the direction of the column is consistent with the direction of parallel P-wells in the memory cell; and the first P-well, the second P-well, the third P-well or the first N-well, and the additional N-well sandwiched between two adjacent P-wells of the memory cell in each column, are all combined as a whole along the direction of the column.

10. The non-volatile memory device of claim 9, further comprising: a bit line, a common line, a control line, and a tunneling line, wherein:
    the common line is connected to the source of each floating-gate transistor in a row of memory cells;
    the control line is connected to one or two N-type coupling regions of each control capacitor in a row of memory cells;
    the tunneling line is connected to one or two N-type coupling regions of each tunneling capacitor in a column of memory cells;
    in the absence of a selection transistor in the device, the bit line is connected to the drain of each floating-gate transistor in a column of memory cells; and
    in the presence of a selection transistor in the device, the bit line is connected to the drain of each selection transistor in a column of memory cells, in which case there is further a word line connected to the gate of each selection transistor in a row of memory cells.

11. The non-volatile memory device of claim 10, wherein the control line is connected to two N-type coupling regions of each control capacitor in a row of memory cells and the first P-well where the control capacitor is located, and the tunneling line is connected to two N-type coupling regions of each tunneling capacitor in a column of memory cells and the second P-well where the tunneling capacitor is located.

12. A multi-time programmable non-volatile memory cell group, comprising: two memory cells of claim 1, named as a first memory cell and a second memory cell, wherein for each of the two cells, the third P-well or the first N-well where the floating-gate transistor is located is located between the first P-well and the second P-well;
   wherein the two floating-gate transistors in the two cells share one source, and the control capacitor and the tunneling capacitor in the first memory cell share one N-type coupling region with the tunneling capacitor and the control capacitor in the second memory cell, respectively; and
   wherein deep N-wells of the two cells are combined as a whole, the first P-well and the second P-well in the first memory cell are combined as a whole with the second P-well and the first P-well in the second memory cell, respectively; and the third P-well or the first N-well in the first memory cell is combined as a whole with that in the second memory cell, and the additional N-well sandwiched between two adjacent P-wells in the first memory cell is also combined as a whole with that sandwiched between two adjacent P-wells in the second memory cell.

13. The memory cell group of claim 12, wherein both the memory cells perform programming and erasing operations at gate oxides of their tunneling capacitors through Fowler-Nordheim tunneling.

14. The non-volatile memory cell of claim 12, wherein a ratio of the area of the gate oxide layer in the control capacitor to the area of the gate oxide layer in the tunneling capacitor in the first memory cell is the same as that in the second memory cell, and the ratios both range from 1.1:1.0 to 50:1.0.

15. The non-volatile memory cell of claim 12, wherein the structure and composition of the first memory cell are the same as those of the second memory cell.

16. A multi-time programmable non-volatile memory device built on a P-type substrate, the memory device comprising: at least one memory cell group of claim 12, wherein deep N-wells of all memory cell groups are combined as a whole and located in the P-type substrate; all the memory cell groups are arranged in multiple rows and columns with the same orientation and arrangement, and the direction of the column is consistent with the parallel direction of parallel P-wells in the memory cell; and the P-wells and the N-wells of the memory cell groups in each column are combined respectively as a whole along the direction of the column.

17. The non-volatile memory device of claim 16, further comprising: a bit line, a common line, a control line, and a tunneling line, wherein:
the common line is connected to the common source of two floating-gate transistors in each memory cell group in a row;
the control line is connected to one or two N-type coupling regions of the control capacitor of the first memory cell and one or two N-type coupling regions of the tunneling capacitor of the second memory cell in each memory cell group in a row;
the tunneling line is connected to one or two N-type coupling regions of the tunneling capacitor of the first memory cell and one or two N-type coupling regions of the control capacitor of the second memory cell in each memory cell group in a column;
in the absence of a selection transistor in the device, the bit line is connected to drains of two floating-gate transistors in each memory cell group in a column; and
in the presence of a selection transistor in the device, the bit line is connected to drains of two selection transistors in each memory cell group in a column, in which case there is further a word line connected to gates of two selection transistors in each memory cell group in a row.

18. The non-volatile memory device of claim 17, wherein:
the control line is connected to two N-type coupling regions of the control capacitor of the first memory cell in each memory cell group in a row and the P-well where the control capacitor is located, and two N-type coupling regions of the tunneling capacitor of the second memory cell in each memory cell group in a row and the P-well where the tunneling capacitor is located; and
the tunneling line is connected to two N-type coupling regions of the tunneling capacitor of the first memory cell in each memory cell group in a column and the P-well where the tunneling capacitor is located, and two N-type coupling regions of the control capacitor of the second memory cell in each memory cell group in a column and the P-well where the control capacitor is located.

* * * * *